United States Patent
Shamoto et al.

(10) Patent No.: US 10,934,630 B2
(45) Date of Patent: Mar. 2, 2021

(54) METHOD FOR DETERMINING LOCATION OF POWER FEEDING POINT IN ELECTROPLATING APPARATUS AND ELECTROPLATING APPARATUS FOR PLATING RECTANGULAR SUBSTRATE

(71) Applicant: EBARA CORPORATION, Tokyo (JP)

(72) Inventors: Mitsuhiro Shamoto, Tokyo (JP); Mizuki Nagai, Tokyo (JP); Naoto Takahashi, Tokyo (JP)

(73) Assignee: EBARA CORPORATION, Tokyo (JP)

(*) Notice: Subject to any disclaimer, the term of this patent is extended or adjusted under 35 U.S.C. 154(b) by 35 days.

(21) Appl. No.: 16/196,985

(22) Filed: Nov. 20, 2018

(65) Prior Publication Data

US 2019/0153610 A1  May 23, 2019

(30) Foreign Application Priority Data

Nov. 22, 2017 (JP) .............................. JP2017-225079

(51) Int. Cl.

| | | |
|---|---|---|
| *C25D 17/00* | (2006.01) | |
| *H01L 21/288* | (2006.01) | |
| *H01L 23/00* | (2006.01) | |
| *C25D 21/12* | (2006.01) | |
| *H01L 21/768* | (2006.01) | |
| *C25D 21/10* | (2006.01) | |

(52) U.S. Cl.
CPC .......... *C25D 17/001* (2013.01); *C25D 17/005* (2013.01); *C25D 21/12* (2013.01); *H01L 21/2885* (2013.01); *H01L 24/742* (2013.01); *C25D 17/008* (2013.01); *C25D 21/10* (2013.01); *H01L 21/76879* (2013.01); *H01L 24/11* (2013.01); *H01L 24/13* (2013.01); *H01L 2224/11462* (2013.01); *H01L 2224/13144* (2013.01); *H01L 2224/13147* (2013.01); *H01L 2224/13155* (2013.01)

(58) Field of Classification Search
CPC ................ C25D 17/001; C25D 17/005; C25D 7/12–123
See application file for complete search history.

(56) References Cited

U.S. PATENT DOCUMENTS

2007/0238265 A1\* 10/2007 Kurashina ........... H01L 21/7684
                                                                  438/470
2015/0275390 A1  10/2015 Tsujino et al.
2017/0372937 A1\* 12/2017 Keigler ................ C25D 17/004

FOREIGN PATENT DOCUMENTS

JP          2015-161028 A       9/2015

\* cited by examiner

*Primary Examiner* — Brian W Cohen
*Assistant Examiner* — Ho-Sung Chung
(74) *Attorney, Agent, or Firm* — BakerHostetler

(57) ABSTRACT

To optimize a location of a power feeding point with the use of a square substrate. There is disclosed a method for determining a location of a power feeding point in an electroplating apparatus. The electroplating apparatus is configured to plate a rectangular substrate having a substrate area of S. The rectangular substrate has opposed two sides coupled to a power supply. The rectangular substrate has a length L of the sides coupled to the power supply and a length W of sides not coupled to the power supply meeting a condition of $0.8 \times L \leq W \leq L$. The method includes determining a number N of the power feeding points according to the substrate area S.

3 Claims, 9 Drawing Sheets

US 10,934,630 B2

METHOD FOR DETERMINING LOCATION OF POWER FEEDING POINT IN ELECTROPLATING APPARATUS AND ELECTROPLATING APPARATUS FOR PLATING RECTANGULAR SUBSTRATE

CROSS-REFERENCE TO RELATED APPLICATION

This application is based upon and claims benefit of priority from Japanese Patent Application No. 2017-225079 filed on Nov. 22, 2017, the entire contents of which is incorporated herein by reference.

TECHNICAL FIELD

The present invention relates to a method for determining a location of a power feeding point in an electroplating apparatus and the electroplating apparatus for plating a rectangular substrate.

BACKGROUND ART

A method for forming a metal film and/or an organic film on a substrate such as a wafer by a plating process has been recently employed in wiring of a semiconductor circuit and a method for forming a bump. The following method has been widely employed. For example, a gold, an argentum, a copper, a solder, a nickel, or a wiring or a bump (a projecting coupling electrode) formed by laminating these substances in multilayer is formed at a predetermined part on a surface of the wafer where the semiconductor circuits and a micro wiring coupling these semiconductor circuits together are formed. The wafer is coupled to an electrode of a package substrate and/or a Tape Automated Bonding (TAB) electrode via this bump. While various methods such as an electroplating method, an electroless plating method, a deposition method, and a printing method are available as the method for forming these wiring and bump, in association with an increase in the number of I/Os of a semiconductor chip and a decrease in pitch, the electroplating method configured to handle miniaturization and featuring a fast film attachment speed has been often used. The metal film obtained by electroplating currently most frequently used features high purity, a fast film formation speed, and ease of a film thickness regulating method.

A general electroplating apparatus couples a substrate to a negative electrode of a power supply, couples an anode to a positive electrode of the power supply, and applies a voltage between the anode and the substrate to form a metal film on the substrate. Here, as disclosed in Japanese Unexamined Patent Application Publication No. 2015-161028 (PTL 1), there has been known that in the case where a power feeding portion is disposed only at a center of an anode, an electrical resistance of the anode generates a difference between a current at the center of the anode and a current at an outer peripheral portion of the anode. The current difference generated in the anode possibly adversely affects uniformity of a thickness of the metal film formed on the substrate.

PTL 1 discloses an anode unit that includes a plurality of radially extending arms fixed to an outer peripheral portion of an anode. PTL 1 discloses that, by supplying an electric power from the power feeding portion to the outer peripheral portion of the anode through the plurality of arms, the current will uniformly flow through the entire anode.

CITATION LIST

Patent Literature

PTL 1: Japanese Unexamined Patent Application Publication No. 2015-161028

SUMMARY OF INVENTION

Technical Problem

It is assumed that an electroplating with an anode unit of PTL 1, a current uniformly flows through an entire anode, and this results in a comparatively uniform plating thickness. However, PTL 1 does not describe optimum fixed positions between the anode and power feeding portions and the optimum number of fixation points in detail. Especially, PTL 1 does not clarify optimum fixed positions and the optimum number of fixation points with the use of a square substrate. Therefore, one object of this application is to optimize a location of a power feeding point with the use of a square substrate.

Solution to Problem

This application discloses a method for determining a location of a power feeding point in an electroplating apparatus as one embodiment. The electroplating apparatus is configured to plate a rectangular substrate having a substrate area of S. The rectangular substrate has opposed two sides coupled to a power supply. The rectangular substrate has a length L of the sides coupled to the power supply and a length W of sides not coupled to the power supply meeting a condition of $0.8 \times L \leq W \leq L$. The method includes determining a number N of the power feeding points according to the substrate area S. The power feeding points are points at which an auxiliary electrode electrically contacts power feeding elements. The auxiliary electrode is configured to assist the plating on the substrate. The power feeding element is configured to supply the auxiliary electrode with an electric power from the power supply.

DESCRIPTION OF EMBODIMENTS

First Embodiment

Figure 1:
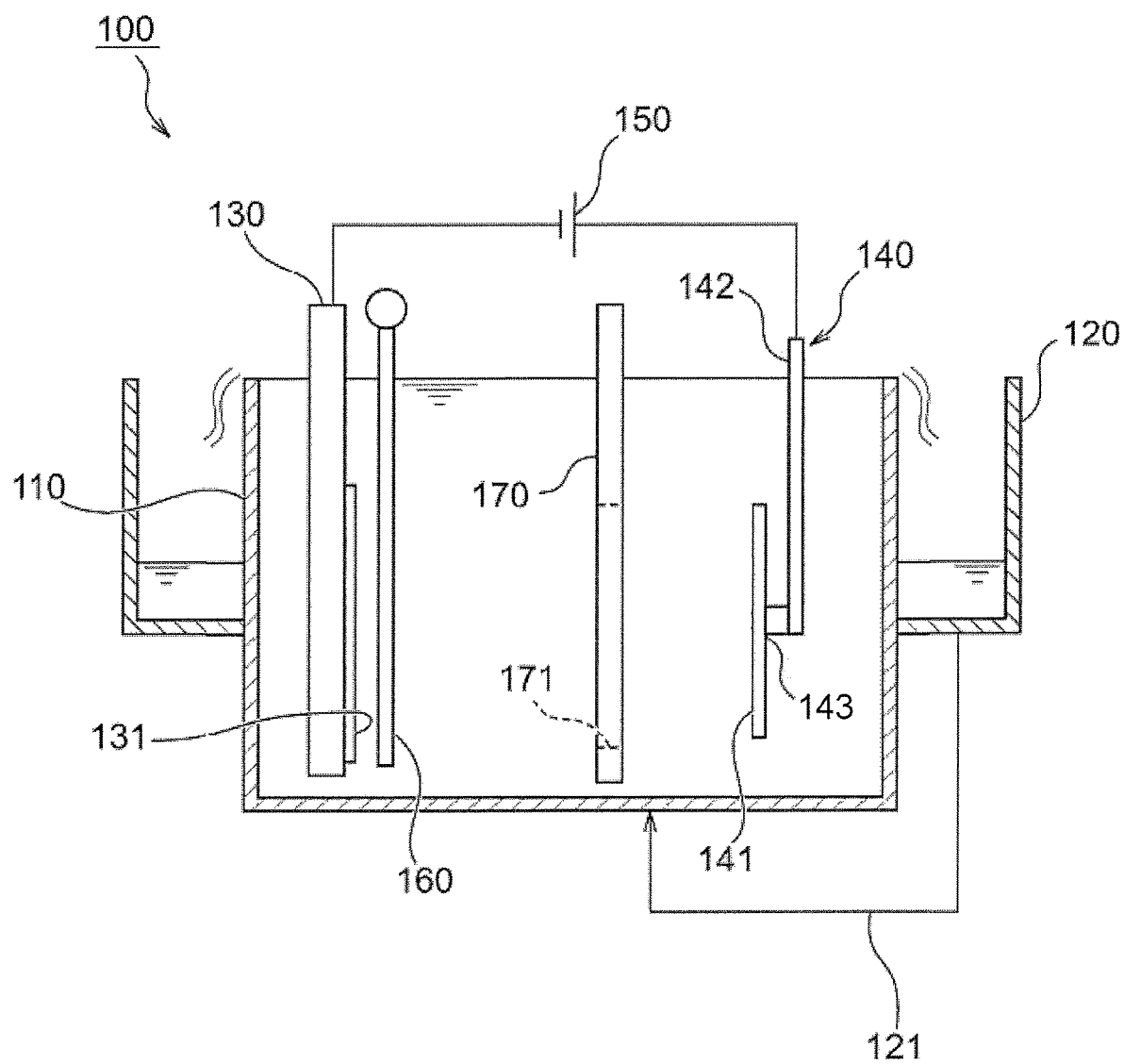
FIG. 1 is a cross-sectional view of an electroplating apparatus according to a first embodiment.

FIG. 1 is a cross-sectional view illustrating an electroplating apparatus 100 according to the first embodiment. Note that FIG. 1 and the other drawings are schematic diagrams. Therefore, shapes, dimensions, positions, and similar specifications of components in the drawings do not necessarily match shapes, dimensions, positions, and similar specifications of the actual components.

The electroplating apparatus 100 of this embodiment includes a plating tank 110. The plating tank 110 is provided to internally hold a plating solution. The plating tank 110 preferably includes an overflow tank 120 at the side portion of the plating tank 110, to catch the overflown plating solution from the plating tank 110. The plating tank 110 is coupled to the overflow tank 120 with a circulation line 121. The plating solution flown into the overflow tank 120 passes through the circulation line 121 and returns to the inside of the plating tank 110.

The electroplating apparatus 100 includes a substrate holder 130 for holding a substrate 131 and for immersing the substrate 131 into the plating solution. The substrate holder 130 is configured so as to removably and vertically hold the substrate 131. The substrate 131 of this embodiment has a square shape.

The electroplating apparatus 100 further includes an auxiliary electrode unit 140. The auxiliary electrode unit 140 includes an auxiliary electrode 141 and a power feeding element 142 to supply an electric power from a power supply 150 to the auxiliary electrode 141. The auxiliary electrode unit 140 may include an auxiliary electrode holder (not illustrated) that holds the auxiliary electrode 141. Here, "auxiliary electrode" means "an electrode on which performing a plating is not intended," in other words, "an electrode that assists the plating." "An electrode on which performing the plating is intended," in other words, "the electrode on which the plating is performed with the assistance by the auxiliary electrode" is the substrate 131. Generally, it can be said that the auxiliary electrode 141 is an electrode to which a voltage having a polarity opposite to a polarity of a voltage applied to the substrate 131 is applied.

The auxiliary electrode 141 is opposed to the substrate 131 at the inside of the plating tank 110. At least a part of the auxiliary electrode 141 is made of a material insoluble to the plating solution. Similarly to the substrate 131, the auxiliary electrode 141 is formed into a square shape. In the following, a surface of the auxiliary electrode 141 opposed to the substrate 131 is referred to as "front surface" (a surface illustrated on the left in FIG. 1). Further, in the following, a surface of the auxiliary electrode 141 on the side opposite to the front surface is referred to as "back surface" (a surface illustrated on the right in FIG. 1).

The power feeding element 142 is fixed to the auxiliary electrode 141. A method for fixing the power feeding element 142 may be any given method, for example, a fixation with a fixture, a fixation by welding, or a similar method is usable. The auxiliary electrode unit 140 may be configured such that a point where the auxiliary electrode 141 electrically contacts the power feeding element 142 (hereinafter referred to as "power feeding point 143") is changeable. The auxiliary electrode 141 is coupled to the power supply 150 via the power feeding element 142.

In FIG. 1, the power feeding point 143 is illustrated so as to be provided by only one point in the center of the auxiliary electrode 141. However, as described later, the position of the power feeding point 143 is not limited to the center of the auxiliary electrode 141. Similarly, the number of power feeding points 143 is not limited to one.

The substrate 131 is coupled to the power supply 150 via a component such as a wiring or an electrode disposed at the substrate holder 130. In this specification, the component such as the wiring disposed at the substrate holder 130 is also regarded as a part of the substrate holder 130. The substrate holder 130 holds the substrate 131 such that the opposed two sides of the substrate 131 are coupled to the power supply 150.

In FIG. 1, the substrate 131 is illustrated so as to be coupled to a negative electrode of the power supply 150 and the auxiliary electrode 141 is illustrated so as to be coupled to a positive electrode of the power supply 150. Accordingly, the auxiliary electrode 141 is an anode in the example of FIG. 1. However, depending on conditions for the plating, the positive and the negative of the electrodes coupled to the substrate 131 and the auxiliary electrode 141 are possibly inverted (the auxiliary electrode 141 possibly serves as a cathode). The power supply 150 may be configured integrally with the electroplating apparatus 100, that is, as a part of the electroplating apparatus 100. Alternatively or additionally, an external power supply may be used as the power supply 150.

The electroplating apparatus 100 can include, for example, a puddle 160 to stir the plating solution and/or a mask 170 to adjust an electric potential or a current inside the plating tank 110. The mask 170 has an opening 171. The electroplating apparatus 100 may further include other elements including a pipe to supply the plating solution, a heater/cooler to adjust the temperature of the plating solution, and other elements.

The applicant performed the following two kinds of simulations to optimize the location of the power feeding point 143. One simulation is an electrode potential simulation at the surface of the auxiliary electrode 141 under certain conditions. The other one simulation is a plating thickness simulation on the substrate 131 using the result of the electrode potential simulation of the auxiliary electrode 141. The plating thickness simulation is performed with the optimum sized opening 171 of the mask 170 under the respective conditions. Furthermore, except for an interaction of the auxiliary electrode 141 with the power feeding element 142 at the power feeding point 143, the electrode potential simulation does not consider an interaction of the auxiliary electrode 141 with other elements (for example, the plating solution). Simultaneously with the simulation of the plating thickness, an interface potential of the auxiliary electrode 141 with the plating solution is simulated from the result of the electrode potential simulation of the auxiliary electrode 141.

Figure 2:
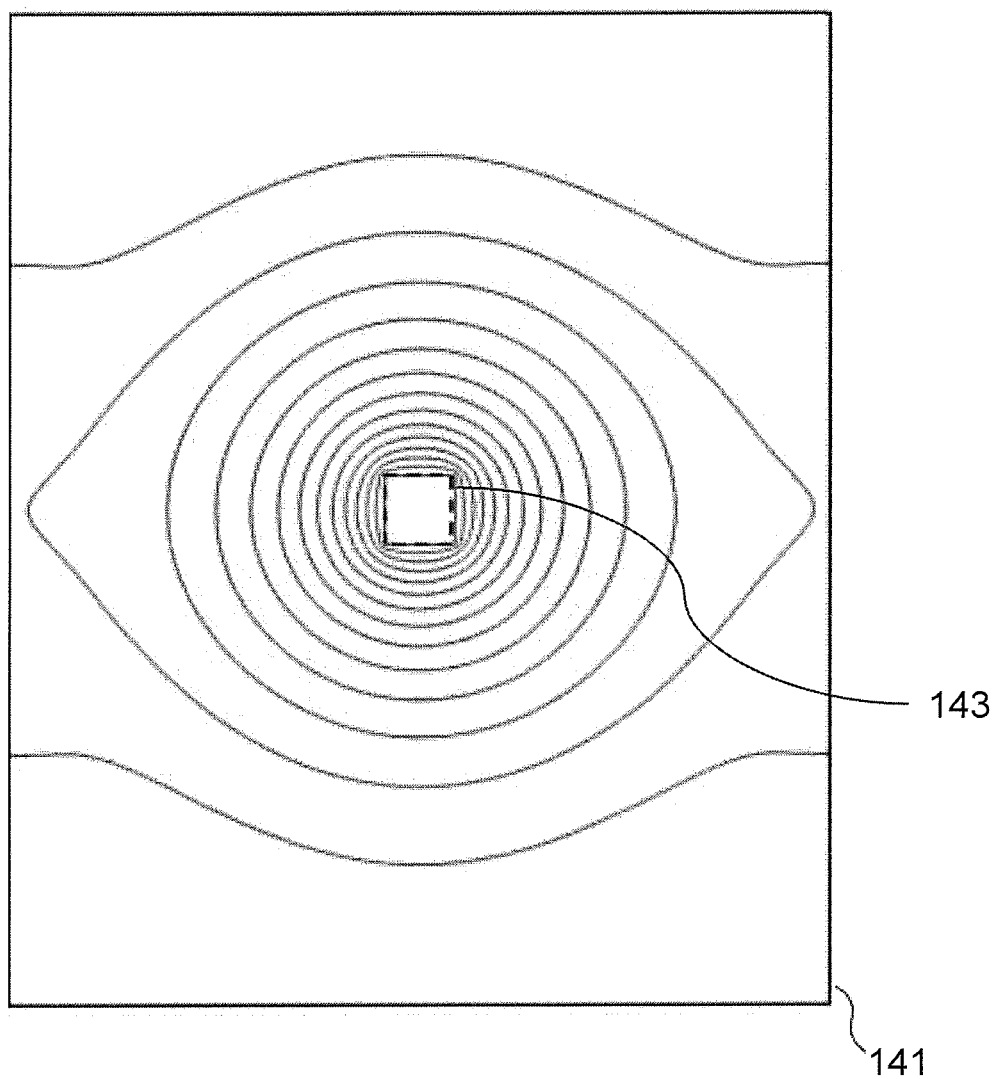
FIG. 2 shows a result of an electric potential simulation of an auxiliary electrode when a power feeding point is present only at a center of the auxiliary electrode.

FIG. 2 illustrates the result of the electrode potential simulation of the auxiliary electrode 141 when the power feeding point 143 is present only at the center of the auxiliary electrode 141. The auxiliary electrode 141 having an elongated rectangle shape with the length in the upper/lower direction of 510 mm and the lateral width of 415 mm was simulated. Furthermore, the auxiliary electrode 141 was simulated as a general insoluble electrode. FIG. 2 illustrates the position of the power feeding point 143 by the dotted line. FIG. 2 further illustrates values (arbitrary unit) of the electric potential of the auxiliary electrode 141 by the solid-line isogram. As can be seen from the isogram, the electric potential distribution of the auxiliary electrode 141 substantially forms a concentric circle around the power feeding point 143 near the center of the electrode. In other words, in the case where the power feeding point 143 is present only at the center of the auxiliary electrode 141, the electric potential distribution of the auxiliary electrode 141 becomes non-uniform.

Figure 3:
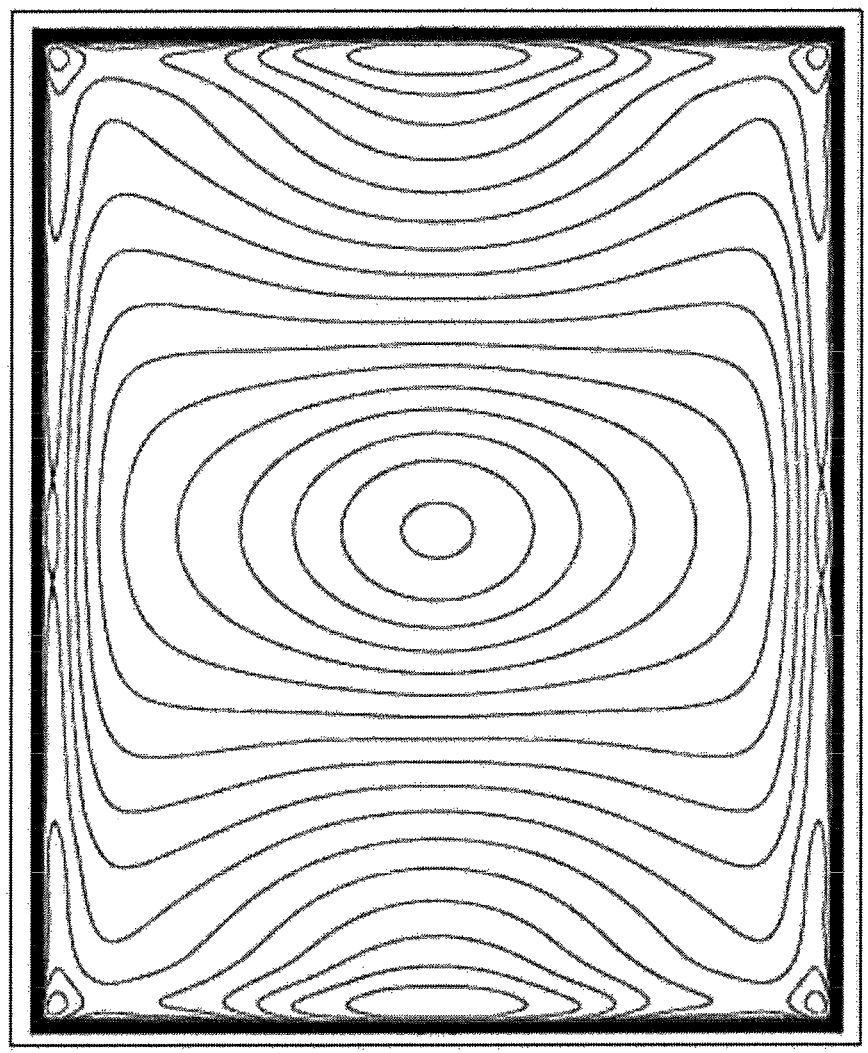
FIG. 3 shows a result of a plating thickness simulation on a substrate when the auxiliary electrode has an electric potential distribution illustrated in FIG. 2.

FIG. 3 illustrates the result of the plating thickness (the film thickness) simulation on the substrate 131 when the auxiliary electrode 141 has the electric potential distribution illustrated in FIG. 2. The substrate 131 having an elongated rectangle shape with the length in the upper/lower direction of 510 mm and the lateral width of 415 mm was simulated. Furthermore, the simulation was performed with an assumption that the substrate 131 was coupled to the power supply 150 along the long side (in the entire part of the long sides) of the substrate 131. In FIG. 3, "the long sides of the substrate 131" are the left side and the right side. Furthermore, the simulation was performed assuming that a metal to be plated is a copper. FIG. 3 illustrates a film thickness (arbitrary unit) of the copper to be plated on the substrate 131 by the solid-line isogram. As can be seen from the isogram, the film thickness on the substrate 131 becomes non-uniform. The film thickness becomes thickest at the center of the substrate 131 (note that parts affected by a terminal effect described later are excluded). The film thickness becomes thinnest at parts slightly close to the center of the substrate 131 from the centers of the short sides of the substrate 131. Assuming the film thickness at the center of the substrate 131 as 1 (a. u.), the film thickness at the thinnest film thickness parts became about 0.968 (thinned by about 3.2%: for the film thickness, also see profiles of FIG. 6A to FIG. 6C described later).

According to studies by the applicant, it has been found that the non-uniformity of the plating thickness on the substrate 131 is probably caused by the non-uniform electric potential distribution of the auxiliary electrode 141. To uniform the electric potential distribution, providing the plurality of power feeding points 143 on the auxiliary electrode 141 is considered to be effective.

Figure 4:
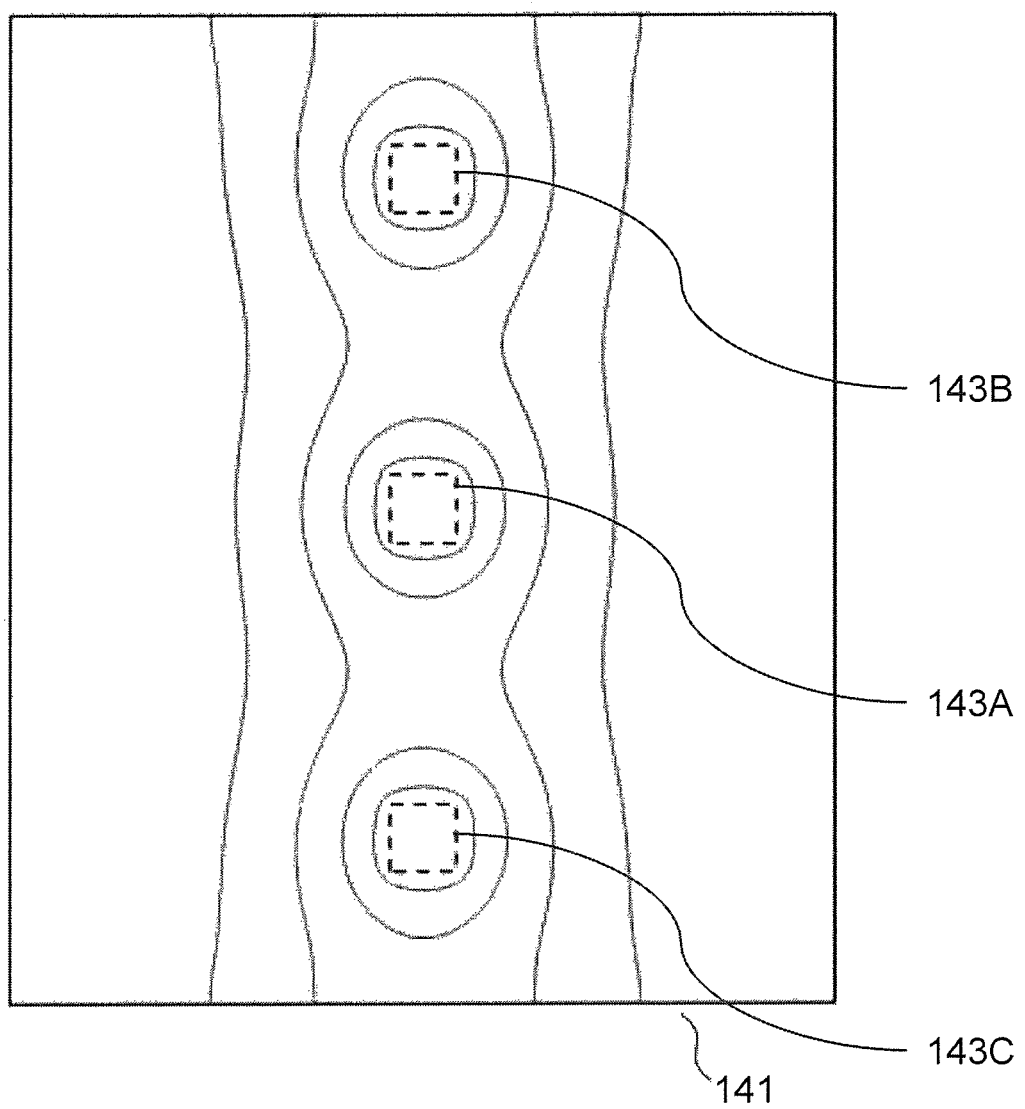
FIG. 4 shows a result of an electric potential simulation of the auxiliary electrode when power feeding points are present by three points on the auxiliary electrode.

FIG. 4 illustrates the result of the electrode potential simulation of the auxiliary electrode 141 when power feeding points 143 (a power feeding point 143A, a power feeding point 143B, and a power feeding point 143C) are present by three points on the auxiliary electrode 141. The respective power feeding points 143 were configured to have identical electric potentials. The power feeding point 143A is positioned at the center of the auxiliary electrode 141. The power feeding point 143B is positioned above the power feeding point 143A. The power feeding point 143C is positioned below the power feeding point 143A. A distance between the power feeding point 143A and the power feeding point 143B was configured to be one-third of the length of the long side of the auxiliary electrode 141. A distance between the power feeding point 143A and the power feeding point 143C was also configured to be one-third of the length of the long side of the auxiliary electrode 141. The other conditions are similar to conditions for the simulation of FIG. 2. As can be seen from the isogram, the electric potential distribution of the auxiliary electrode 141 in this simulation is uniformed compared with the electric potential distribution of FIG. 2.

Figure 5:
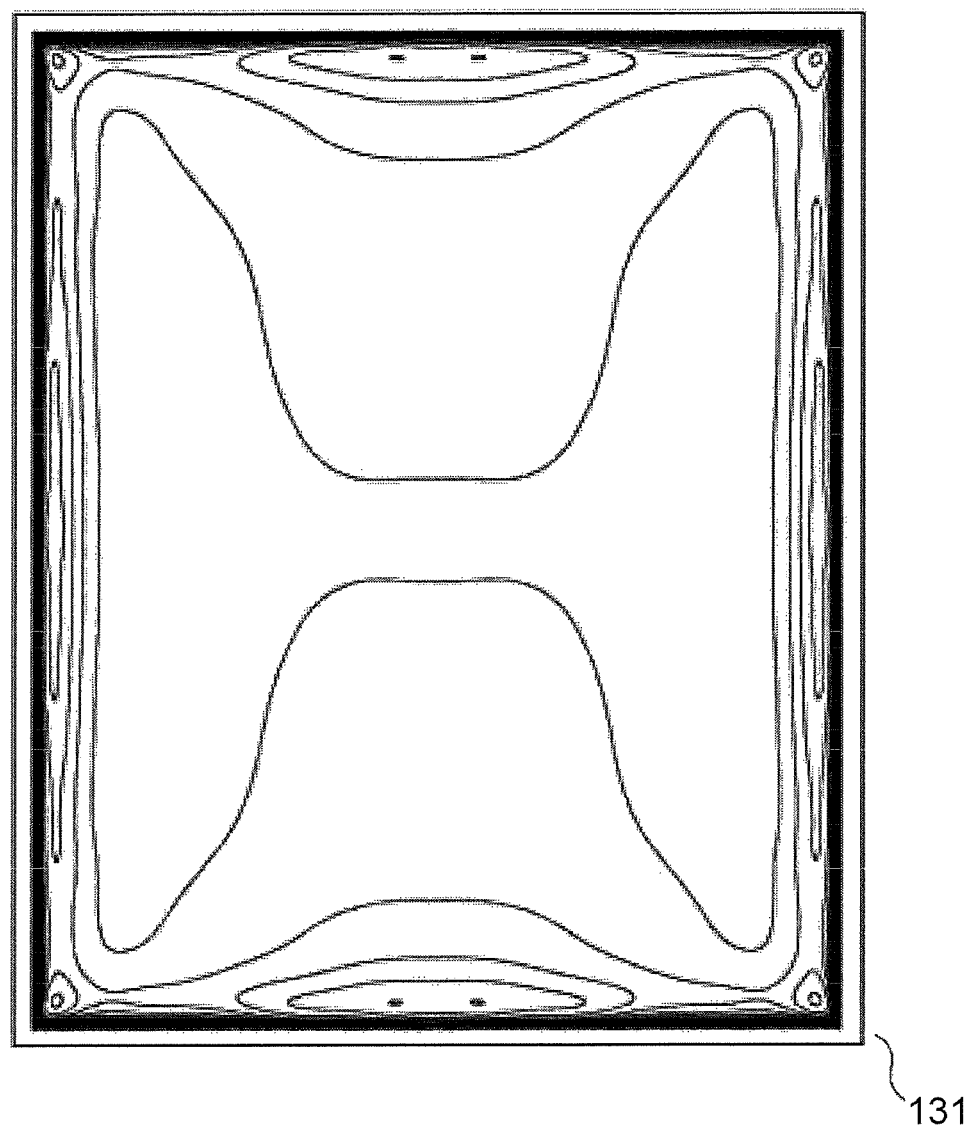
FIG. 5 shows a result of a plating thickness simulation on the substrate when the auxiliary electrode has an electric potential distribution illustrated in FIG. 4.

FIG. 5 illustrates the result of the plating thickness simulation on the substrate 131 when the auxiliary electrode 141 has the electric potential distribution illustrated in FIG. 4. Conditions for this simulation other than the location of the power feeding points 143 of the auxiliary electrode 141 are similar to the conditions for the simulation of FIG. 3. In the simulation of FIG. 5, assuming the film thickness at the center of the substrate 131 as 1 (a.u.), the film thickness at the thinnest parts became about 0.996 (thinned by about 0.4%: for the film thickness, also see the profiles of FIG. 6A to FIG. 6C described later). In comparison with the film thickness difference (about 3.2%) in FIG. 3, the uniformity of the film thickness is greatly improved in FIG. 5.

Figure 6A:
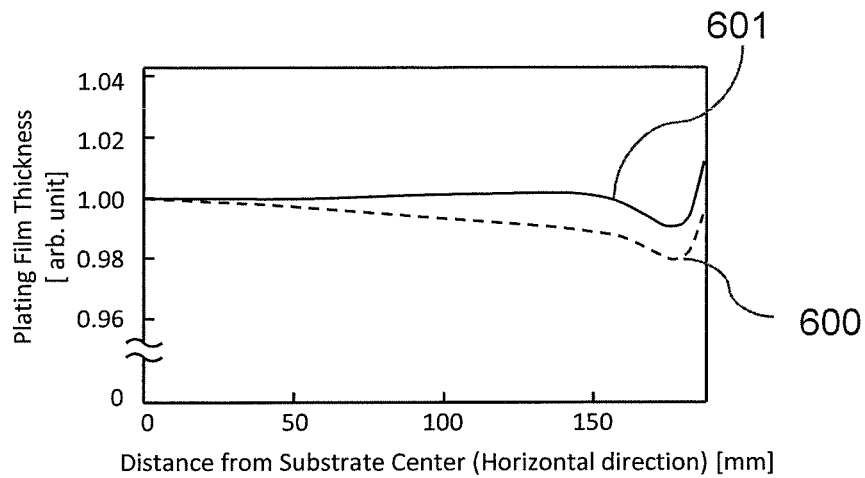
FIG. 6A shows profiles of film thicknesses on lines drawn from centers of the substrates along lateral directions in the simulations of FIG. 3 and FIG. 5.
Figure 6B:
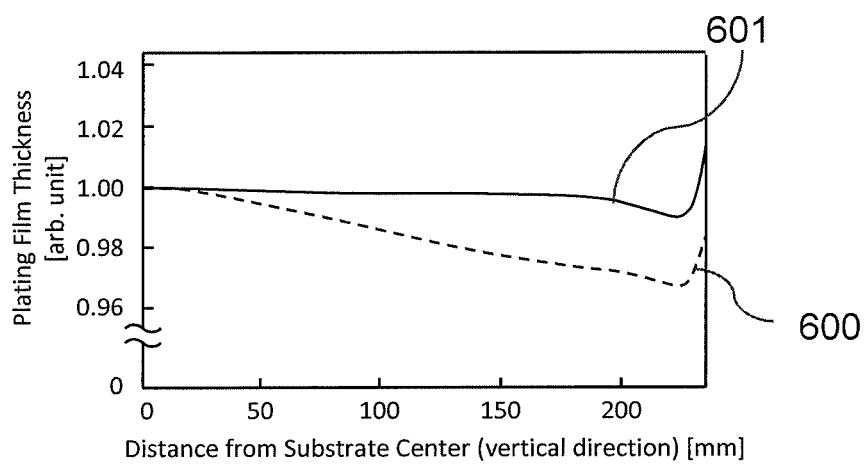
FIG. 6B shows profiles of film thicknesses on lines drawn from the centers of the substrates along upper/lower directions in the simulations of FIG. 3 and FIG. 5.
Figure 6C:
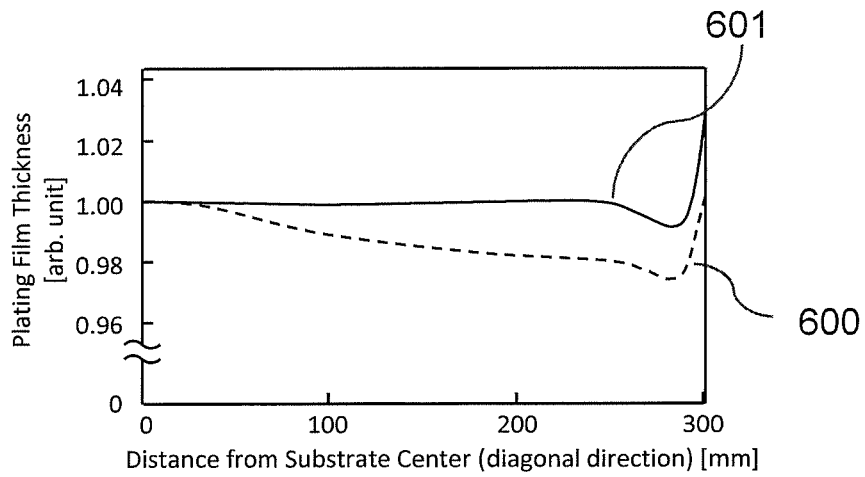
FIG. 6C shows profiles of film thicknesses on lines drawn from the centers of the substrates along diagonal directions in the simulations of FIG. 3 and FIG. 5.

For detailed comparison, FIG. 6A to FIG. 6C illustrate the profiles of the film thicknesses in the simulations of FIG. 3 and FIG. 5. FIG. 6A illustrates the profiles of the film thicknesses on lines drawn from the centers of the substrates 131 along the lateral directions. FIG. 6B illustrates the profiles of film thicknesses on lines drawn from the centers of the substrates 131 along upper/lower directions. FIG. 6C illustrates the profiles of film thicknesses on lines drawn from the centers of the substrates 131 along directions toward corners of the substrates 131 (diagonal directions). In the simulations of FIG. 3 and FIG. 5, the film thicknesses on the substrates 131 became laterally symmetrical and longitudinally symmetrical. Accordingly, FIG. 6A to FIG. 6C illustrate the unidirectional profiles starting from the centers of the substrates 131. The dotted lines for which reference numerals "600" are assigned in FIG. 6A to FIG. 6C indicate the profiles of the film thicknesses in the simulation of FIG. 3. The solid lines for which reference numerals "601" are assigned in FIG. 6A to FIG. 6C indicate the profiles of the film thicknesses in the simulation of FIG. 5.

The profile 600 has a downward trend in all directions of the lateral direction, the upper/lower direction, and the diagonal direction. In other words, the film thickness under the conditions of FIG. 3 is thinned as approaching the end portions (edges) of the substrate 131. Note that the film thickness is rapidly thinned at regions separated from the end portions of the substrate 131 to some extent (regions separated from the end portions by about 20 to 40 mm) as approaching the end portions. Furthermore, the film thickness is considerably and rapidly thickened, as approaching the end portions, at regions adjacent to the end portions of the substrate 131 (regions within about 20 mm from the end portions). The parts near the end portions of the substrate 131 are considered to be affected by the terminal effect.

The profile 601 is substantially horizontal (excluding the regions affected by the terminal effect) in all directions of the lateral direction, the upper/lower direction, and the diagonal direction. In other words, the film thickness under the conditions of FIG. 5 is approximately uniform on the substrate 131.

For further detailed comparison, statistic indexes on the film thicknesses in the simulations of FIG. 3 and FIG. 5 are shown in Table 1.

TABLE 1

| | 3 × σ/ave [%] | Range/(2 × ave) [%] |
|---|---|---|
| Simulation of FIG. 3 | 4.2 | 3.7 |
| Simulation of FIG. 5 | 2.7 | 3.5 |

Here, the σ indicates a standard deviation. The ave indicates an average value (an arithmetic average) of the film thicknesses. The Range indicates (maximum value of film thickness–minimum value of film thickness). The σ/ave indicates a coefficient of variation. The Range/(2×ave) is an index indicative of in-plane uniformity in the film thickness. It has been found from the statistic indexes that the uniformity in film thickness in the simulation of FIG. 5 is improved compared with the uniformity in film thickness in the simulation of FIG. 3.

It has been proved from the above-described results of simulation that changing the location(s) of the power feeding point(s) 143 may change the uniformity in the film thickness on the substrate 131. However, a great deal of studies by the applicant have proved that the increase in the number of power feeding points 143 does not always improve the uniformity in film thickness. Further studies by the applicant have found conditions for the optimum location of the power feeding point 143.

According to the knowledge obtained by the applicant, the optimum number of power feeding point(s) 143 is closely associated with the area of the substrate 131. Furthermore, the optimum position of the power feeding point 143 is closely associated with the lengths of the sides of the substrate 131. Note that it is assumed that the substrate 131 has a rectangular shape and the opposed two sides are coupled to the power supply 150. Additionally, with the substrate 131 has an elongated rectangle shape, it is assumed that the substrate 131 is electrically coupled to the power supply 150 at the two long sides. A length of the sides of the substrate 131 coupled to the power supply 150 is referred to as "length L." A length of sides of the substrate 131 not coupled to the power supply 150 is referred to as "width W." Moreover, it is assumed that the length L and the width W meet the following conditions.

$$0.8 \times L \leq W \leq L$$

In the following, it is assumed that the sides of the substrate 131 coupled to the power supply 150 are located to be parallel to the upper/lower direction. The area of the substrate 131 is denoted by S. Additionally, the auxiliary electrode 141 may have any given size, as long as a required power feeding point among a power feeding point 143-1, a power feeding point 143-2, a power feeding point 143-3, and a power feeding point 143-4 can be provided (143-1 to 143-3 are described later). The auxiliary electrode 141 may preferably have the size larger than that of the substrate 131.

The number N of power feeding points 143 is preferably determined according to the area S as follows.

With $0 < S \leq 0.14$ m$^2$: N=1
With $0.14$ m$^2 < S \leq 0.18$ m$^2$: N=1 or 3
With $0.18$ m$^2 < S \leq 0.23$ m$^2$: N=3
With $0.23$ m$^2 < S \leq 0.27$ m$^2$: N=3 or 5
With $0.27$ m$^2 < S \leq 0.29$ m$^2$: N=5
With $0.29$ m$^2 < S \leq 0.33$ m$^2$: N=5 or 7
With $0.33$ m$^2 < S \leq 0.34$ m$^2$: N=7
With $0.34$ m$^2 < S \leq 0.36$ m$^2$: N=7 or 9
With $0.36$ m$^2 < S$: N=9

The number N of power feeding points 143 is most preferably determined according to the area S as follows.

With $0 < S \leq 0.16$ m$^2$: N=1
With $0.16$ m$^2 < S \leq 0.25$ m$^2$: N=3
With $0.25$ m$^2 < S \leq 0.31$ m$^2$: N=5
With $0.31$ m$^2 < S \leq 0.36$ m$^2$: N=7
With $0.36$ m$^2 < S$: N=9

In the most preferred case, the conditions do not overlap with one another. Thus, the number N of power feeding points 143 is unambiguously defined. As described above, N is an odd number from 1 to 9.

When a plurality of electrodes are coupled to the auxiliary electrode 141 in an almost adjacent positions, these electrodes substantially work as the single power feeding point 143. In this specification, the electrodes substantially functioning as single power feeding point 143 are regarded as "single power feeding point." An example being regarded as "single power feeding point" includes the case of a plurality of electrodes with a distance between the electrodes of 30 mm or less, 20 mm or less, or 10 mm or less. When the plurality of electrodes are regarded as "single power feeding point," a center of gravity of a polygon drawn with the respective electrodes may be regarded as the position of the power feeding point.

Figure 7:
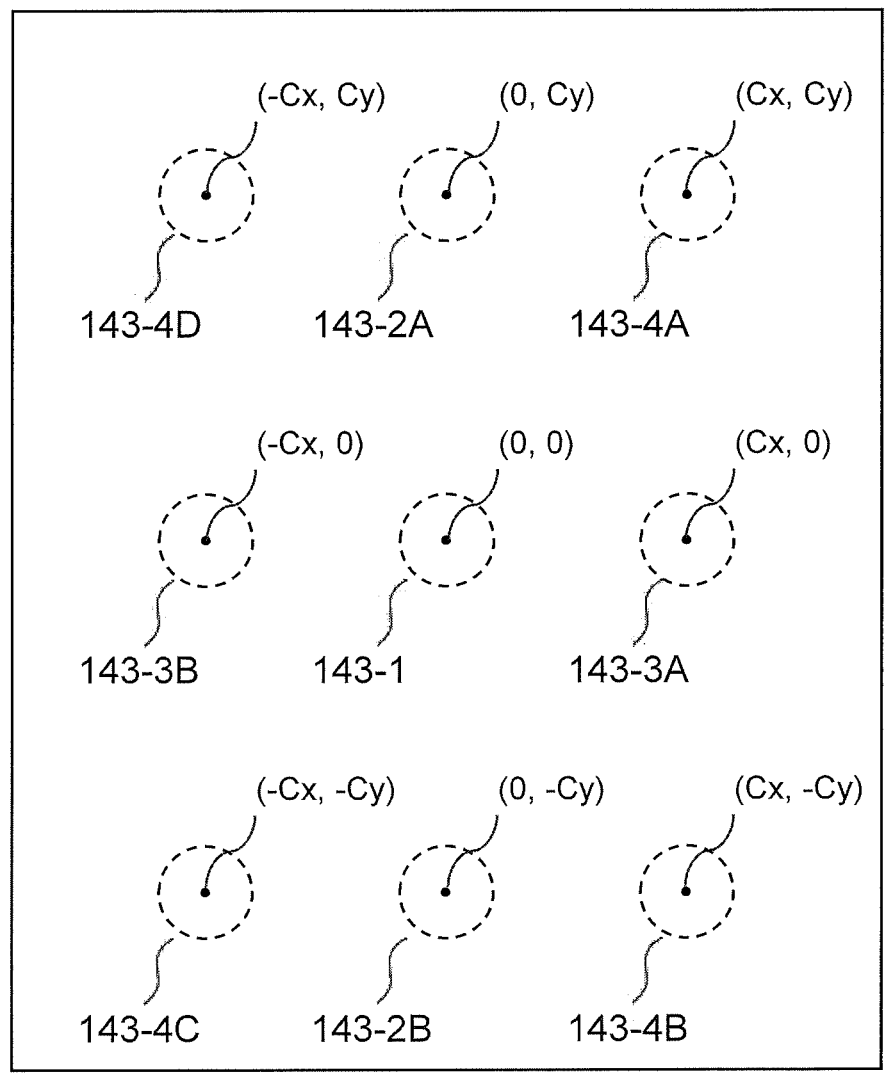
FIG. 7 is a drawing of the auxiliary electrode illustrating positions where the power feeding point can be provided.

According to the number N of the power feeding points 143, the power feeding points 143 are located as illustrated in FIG. 7 FIG. 7 illustrates the positions where the power feeding point 143 can be provided. With N=1, the power feeding point 143 is provided at the position denoted by reference numeral "143-1" in FIG. 7, that is, the center of the auxiliary electrode 141. Note that "the center of the auxiliary electrode 141" is not strictly limited to the center. As long as the position of the power feeding point 143-1 is within one-sixth of the length of the auxiliary electrode 141 along the upper/lower direction, the position may be displaced from the strict center in the upper/lower direction. As long as the position of the power feeding point 143-1 is within one-sixth of the length of the auxiliary electrode 141 along the lateral direction, the position may be displaced in the lateral direction from the strict center. Here, in the case where the electroplating apparatus 100 includes the mask 170 or a similar component, "the length of the auxiliary electrode 141" does not need to be the actual length of the auxiliary electrode 141 but may be a length of a part of the auxiliary electrode 141 opposed to the substrate 131 via the opening 171 on the mask 170 or a similar component.

With N=3, the power feeding points 143 are provided at positions denoted by reference numerals "143-1" and "143-2" in FIG. 7. The power feeding point 143-2 includes two power feeding points 143-2A and 143-2B. The power feeding point 143-2A is positioned above the power feeding point 143-1. The power feeding point 143-2B is positioned below the power feeding point 143-1. A distance between the power feeding point 143-1 and the power feeding point 143-2A is approximately equal to a distance between the power feeding point 143-1 and the power feeding point 143-2B, or the most preferably, the distances are completely equal. Accordingly, with N=3, the three power feeding points 143 are longitudinally arranged.

With N=5, the power feeding points 143 are provided at positions denoted by reference numerals "143-1," "143-2," and "143-3." The power feeding point 143-3 includes two power feeding points 143-3A and 143-3B. The power feeding point 143-3A is positioned to the right of the power feeding point 143-1. The power feeding point 143-3B is positioned to the left of the power feeding point 143-1. A distance between the power feeding point 143-1 and the power feeding point 143-3A is approximately equal to a distance between the power feeding point 143-1 and the power feeding point 143-3B, or the most preferably, the distances are completely equal. Accordingly, with N=5, the five power feeding points 143 are arranged in a cross shape.

With N=7, the power feeding points 143 are provided at positions denoted by reference numerals "143-1," "143-2," and "143-4." The power feeding point 143-4 includes four power feeding points 143-4A, 143-4B, 143-4C, and 143-4D. The power feeding point 143-4A is positioned to the right of the power feeding point 143-2A and above the power feeding point 143-3A. The power feeding point 143-3B is positioned to the right of the power feeding point 143-2B and below the power feeding point 143-3A. The power feeding point 143-3C is positioned to the left of the power feeding point 143-2B and below the power feeding point 143-3B. The power feeding point 143-3D is positioned to the left of the power feeding point 143-2B and above the power feeding point 143-3B. Accordingly, with N=7, the seven power feeding points 143 are arranged in an I shape.

With N=9, the power feeding points 143 are provided at positions denoted by reference numerals "143-1," "143-2," "143-3," and "143-4," that is, all positions illustrated in FIG. 7. Accordingly, with N=9, the nine power feeding points 143 are arranged in a rectangular grid shape of three lines and three rows.

The positions of the power feeding points 143 are expressible by a coordinate (x, y) when a coordinate of the power feeding point 143-1, which is positioned at the center of the auxiliary electrode 141, is defined as (0, 0). Note that the right side in FIG. 7 is assumed as the positive direction of x, and the upper side of FIG. 7 is assumed as the positive direction of y. The positions of the respective points to which the power feeding points 143 can be set are expressed as follows.

Coordinate of the power feeding point 143-1: (0, 0)

Coordinate of the power feeding point 143-2: (0, ±$C_y$)

Coordinate of the power feeding point 143-3: (±$C_x$, 0)

Coordinate of the power feeding point 143-4: (±$C_x$, ±$C_y$)

Here, (0, ±$C_y$) is a generic term for the two points, (0, $C_y$) and (0, −$C_y$). (±$C_x$, 0) is a generic term for the two points, ($C_x$, 0) and (−$C_x$, 0). (±$C_x$, ±$C_y$) is a generic term for the four points, ($C_x$, $C_y$), ($C_x$, −$C_y$), (−$C_x$, −$C_y$), and (−$C_x$, $C_y$). $C_x$ and $C_y$ are determined by the lengths of the sides of the substrate 131. Specifically, $C_y$ is determined by the length L of the substrate 131. $C_x$ is determined by the width W of the substrate 131.

The applicant simulated plating thicknesses of some rectangular substrates having the specific values, "length L" and "width W," to obtain the optimum $C_y$. The applicant has found that the relationship between $C_y$ and the length L is most preferably $C_y$=0.3244L+10.8. Note that the units of $C_y$ and L are mm. Alternatively, $C_y$ may be determined so as to meet the following simultaneous inequality.

$$\begin{cases} 0.3244L - 9.2 \le C_y \\ C_y \le 0.3244L + 30.8 \end{cases} \quad \text{[Math. 1]}$$

Compared with the case of the most preferred value of $C_y$, for $C_y$ meeting the above-described simultaneous inequality, 3×σ/ave increases only by about 0.5% at the maximum (Note that the comparison was performed assuming that the power feeding point 143-1 was positioned at the strict center of the auxiliary electrode 141 and the value of $C_x$ was the most preferred value, as described later). That is, determining $C_y$ so as to meet the above-described inequality also allows improving the uniformity in plating film thickness. Note that, since $C_y$ is a positive value, the case where the above-described simultaneous inequality is satisfied is limited to the case of L being about 29 mm or more.

When the applicant similarly obtained the optimum $C_x$, the applicant has found that the relationship between $C_x$ and the width W is most preferably $C_x$=0.5727W−110.8. Note that the units of $C_x$ and W are mm. Alternatively, $C_x$ may be determined so as to meet the following simultaneous inequality.

$$\begin{cases} 0.5727W - 120.8 \le C_x \\ C_x \le 0.5727W - 100.8 \end{cases} \quad \text{[Math. 2]}$$

Compared with the case of the most preferred value of $C_x$, for $C_x$ meeting the above-described simultaneous inequality, 3×σ/ave increases only by about 0.5% at the maximum (Note that the comparison was performed assuming that the power feeding point 143-1 was positioned at the strict center of the auxiliary electrode 141 and the value of the $C_y$ was the most preferred value, as described above). That is, determining $C_x$ so as to meet the above-described inequality also allows improving the uniformity in plating film thickness. Note that, since $C_x$ is a positive value, the case where the above-described simultaneous inequality is satisfied is limited to the case of W being about 211 mm or more.

Note that L and W need to be values satisfying the above-described two simultaneous inequalities and also need to meet the above-described relational expression (0.8×L≤W≤L). Accordingly, the minimum value of L is about 169 mm and the minimum value of W is about 211 mm. Accordingly, the minimum value of the substrate area S becomes about 0.035 m². Note that with N=1, since the power feeding point 143 is positioned only at the coordinate (0, 0), the above-described two simultaneous inequalities do not need to be satisfied.

The above-described procedure determines the optimum location of the power feeding point 143 according to the area of the substrate 131, the length L, and the width W. Optimally locating the power feeding point 143 allows uniformly plating the substrate 131.

The description above premises that the sides of the substrate 131 coupled to the power supply 150 are located to be parallel to the upper/lower direction. When the sides of the substrate 131 coupled to the power supply 150 are located along a direction inclined with respect to the upper/lower direction, the use of a configuration of the auxiliary electrode 141 being similarly inclined is preferred. In other words, "upper/lower direction" in this specification does not always indicate "vertical direction" and "lateral direction" does not always indicate "horizontal direction."

Second Embodiment

For example, as illustrated in FIG. 2, there may be a case where the electric potential distribution of the auxiliary electrode is simulated to examine the configuration of the electroplating apparatus. However, the electric potential distribution obtained as the result of simulation does not always match the actual electric potential distribution. For better simulation, it could be necessary to compare the electric potential distribution obtained as the result of the simulation with the actual electric potential distribution and optimize the conditions for simulation.

There has been conventionally known an electroplating apparatus that includes a function or a mechanism to measure an average overvoltage of the entire auxiliary electrode. However, it was difficult for the conventional electroplating apparatus to locally measure the electric potential of the auxiliary electrode, that is, it was difficult to obtain the electric potential distribution (an overvoltage distribution) of the auxiliary electrode. As described in the description regarding the first embodiment, since the electric potential distribution of the auxiliary electrode affects the uniformity in plating film thickness, obtaining the electric potential distribution of the auxiliary electrode is considerably important. Therefore, the second embodiment describes a configuration appropriate for the local measurement of the electric potential of the auxiliary electrode.

Figure 8:
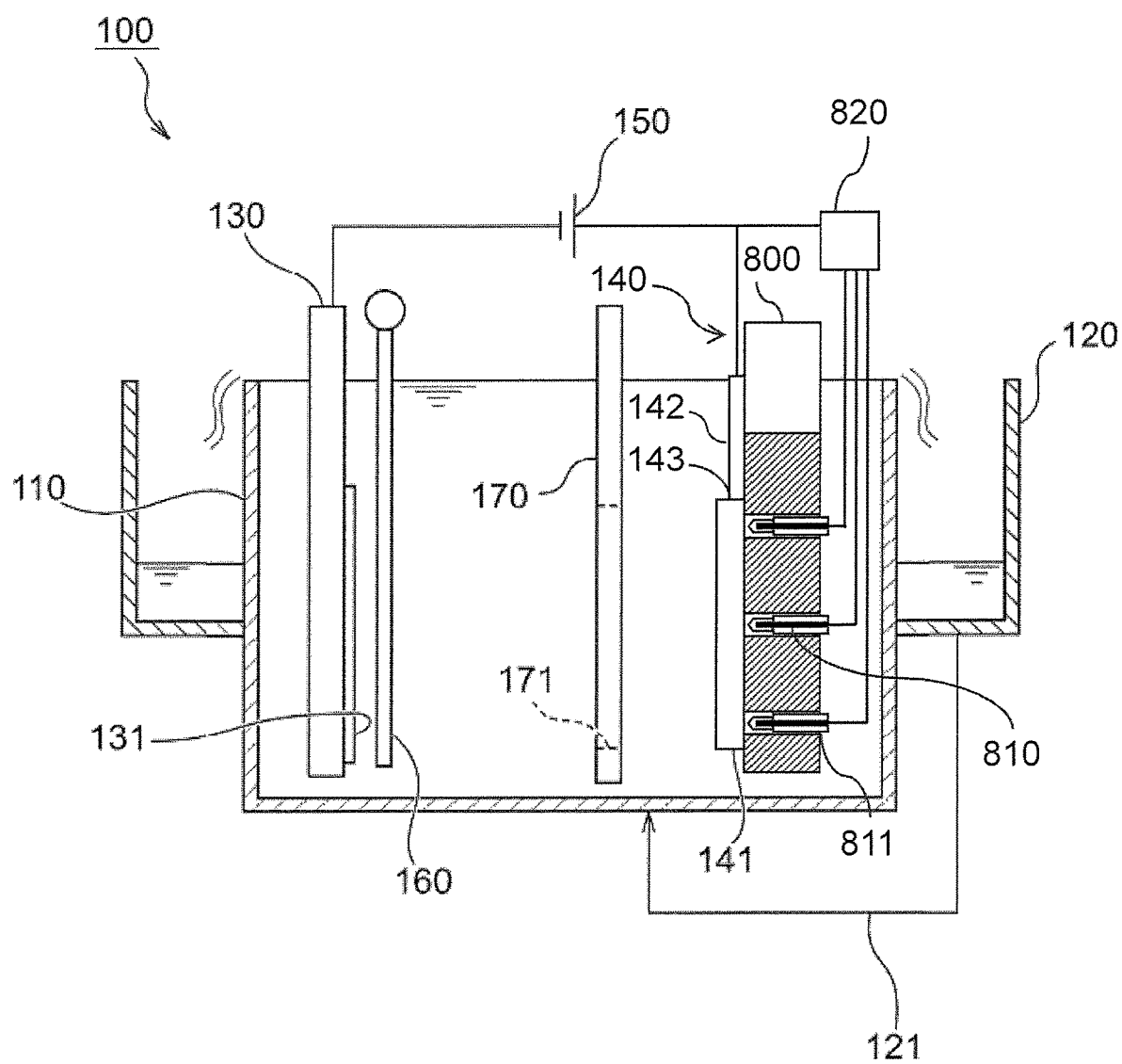
FIG. 8 is a cross-sectional view of the electroplating apparatus according to a second embodiment.

FIG. 8 is a cross-sectional view illustrating the electroplating apparatus 100 according to this embodiment. The electroplating apparatus 100 of FIG. 8 further includes an auxiliary electrode holder 800 to hold the auxiliary electrode 141 in addition to the configuration of the electroplating apparatus 100 of FIG. 1. The shape of the substrate 131 of this embodiment is not limited to the square shape but may be a shape such as a circular shape. The power feeding point 143 may be provided at any given position on the auxiliary electrode 141. For example, the location of the power feeding point 143 may be determined by the method described in the first embodiment.

The auxiliary electrode holder 800 is configured to allow disposing a plurality of reference electrodes 810. In the example of FIG. 8, the reference electrodes 810 are housed in Luggin capillaries 811. The reference electrodes 810 have electric potentials approximately identical to electric potentials near the tops of the Luggin capillaries 811. Accordingly, by positioning the tops of the Luggin capillaries 811 near the auxiliary electrode 141 and measuring the electric potentials of the reference electrodes 810 by an electric potential measuring mechanism 820, the local electric potential of the auxiliary electrode 141 can be measured.

In the example of FIG. 8, a potentiometer that compares and measures the electric potentials of the respective reference electrodes 810 (that is, the local electric potential of the auxiliary electrode 141) with the electric potential of the power supply 150 is disposed as the electric potential measuring mechanism 820. Besides, as the electric potential measuring mechanism 820, a voltmeter that measures absolute values of the electric potentials of the reference electrodes 810 may be employed.

Figure 9:
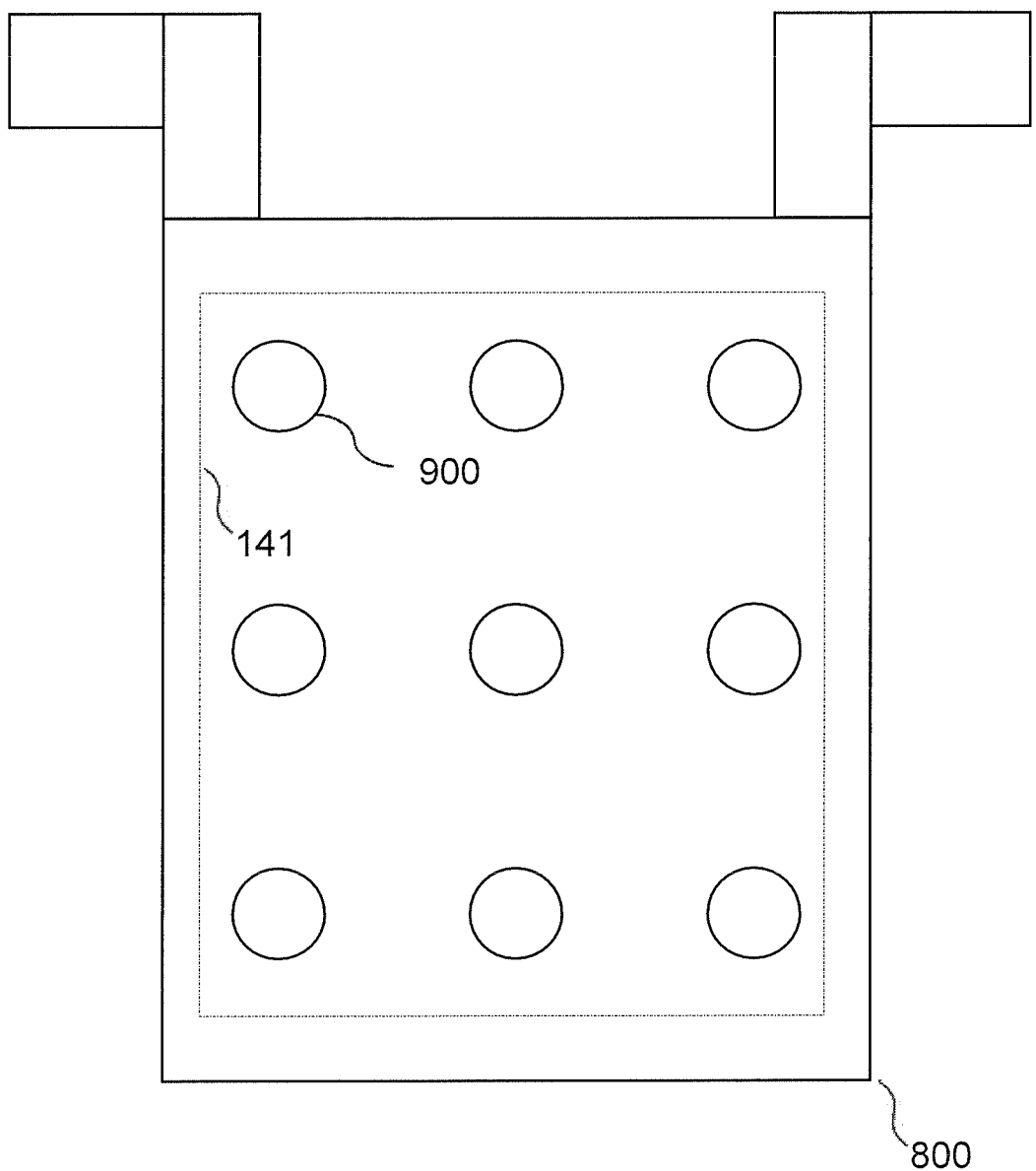
FIG. 9 is a front view of an auxiliary electrode holder according to the second embodiment.

FIG. 9 is a front view illustrating the auxiliary electrode holder 800 according to this embodiment. In FIG. 9, the square auxiliary electrode 141 held by the auxiliary electrode holder 800 is illustrated by an imaginary line. Note that the shape of the auxiliary electrode 141 is not limited to the square shape but may be other shapes such as a circular shape. The shape of the auxiliary electrode holder 800 may be changed according to the shape of the auxiliary electrode 141. In the example of FIG. 9, a plurality of Luggin capillary holding holes 900 are provided on the auxiliary electrode holder 800. The respective Luggin capillary holding holes 900 are through-holes. The Luggin capillaries 811 are inserted into the Luggin capillary holding holes 900 from a back (a surface not holding the auxiliary electrode 141) of the auxiliary electrode holder 800. While the total nine Luggin capillary holding holes 900 are provided by three lines and three rows in FIG. 9, the number of Luggin capillary holding holes 900 is not limited. Increasing the number of Luggin capillary holding holes 900 can increase the measuring points for the electric potential.

The method for holding the Luggin capillaries 811 with the Luggin capillary holding holes 900 is merely one example. The Luggin capillary holding hole 900 does not need to be the through-hole but may be a blind hole. As long as the electric potentials of the reference electrodes 810 are measurable and the tops of the Luggin capillaries 811 can be positioned near the auxiliary electrode 141, the Luggin capillaries 811 may be held by any other holding method.

The configuration of this embodiment allows locally measuring the electric potential of the auxiliary electrode 141 and obtaining the electric potential distribution of the auxiliary electrode 141. This ensures the comparison between the electric potential distribution obtained by the measurement and the electric potential distribution obtained by the simulation. Additionally, the configuration of this embodiment allows daily monitoring the electric potential distribution of the auxiliary electrode 141 and grasping a secular change in the electric potential distribution of the auxiliary electrode 141. By grasping the secular change in the electric potential distribution, a failure part in the electroplating apparatus 100 can be identified and a necessity for a maintenance work of the electroplating apparatus 100 can be grasped.

Several embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective constituent elements described in the claims and specification in a range in which at least a part of the above-described problems can be solved, or in which at least a part of the effects can be exhibited.

This application discloses a method for determining a location of a power feeding point in an electroplating apparatus as one embodiment. The electroplating apparatus is configured to plate a rectangular substrate having a substrate area of S. The rectangular substrate has opposed two sides coupled to a power supply. The rectangular substrate has a length L of the sides coupled to the power supply and a length W of sides not coupled to the power supply meeting a condition of $0.8 \times L \leq W \leq L$. The method includes determining a number N of the power feeding points according to the substrate area S. The power feeding points are points at which an auxiliary electrode electrically contacts power feeding elements. The auxiliary electrode is configured to assist the plating on the substrate. The power feeding element is configured to supply the auxiliary electrode with an electric power from the power supply.

Further, this application discloses, as one embodiment, the method for determining the location of the power feeding point, including, determining N in accordance with conditions of:

with $0 < S \leq 0.14$ m$^2$: N=1;
with $0.14$ m$^2 < S \leq 0.18$ m$^2$: N=1 or 3;
with $0.18$ m$^2 < S \leq 0.23$ m$^2$: N=3;
with $0.23$ m$^2 < S \leq 0.27$ m$^2$: N=3 or 5;
with $0.27$ m$^2 < S \leq 0.29$ m$^2$: N=5;
with $0.29$ m$^2 < S \leq 0.33$ m$^2$: N=5 or 7;
with $0.33$ m$^2 < S \leq 0.34$ m$^2$: N=7;
with $0.34$ m$^2 < S \leq 0.36$ m$^2$: N=7 or 9; and
with $0.36$ m$^2 < S$: N=9.

Further, this application discloses, as one embodiment, the method for determining the location of the power feeding point, including, positioning one power feeding point at a center of the auxiliary electrode, and further positioning the power feeding points at the following respective points.

with N=3: $(0, \pm C_y)$
with N=5: $(0, \pm C_y)$ and $(\pm C_x, 0)$
with N=7: $(0, \pm C_y)$ and $(\pm C_x, \pm C_y)$
with N=9: $(0, \pm C_y)$, $(\pm C_x, 0)$, and $(\pm C_x, \pm C_y)$ Here, an x-direction is a direction along the sides of the substrate not coupled to the power supply. Here, a y-direction is a direction along the sides of the substrate coupled to the power supply. Here, (0,0) is a coordinate of the power feeding point located at the center of the auxiliary electrode.

Further, this application discloses, as one embodiment, the method for determining the location of the power feeding point, wherein
L≥169 mm, and W≥211 mm,
$C_y$ using mm as a unit meets conditions of:

$$0.3224L-9.2 \leq C_y; \text{ and}$$

$$C_y \leq 0.3224L+30.8, \text{ while}$$

$C_x$ using mm as a unit meets conditions of:

$$0.5727W-120.8 \leq C_x; \text{ and}$$

$$C_x \leq 0.5727W-100.8.$$

The determination on the location of the power feeding point by any of the above-described methods makes the optimum number of power feeding points and/or the optimum positions possible. Optimally locating the power feeding points allows achieving the uniform plating.

Further, this application discloses an electroplating apparatus for plating a rectangular substrate as one embodiment. The electroplating apparatus includes a substrate holder, an auxiliary electrode, and a power feeding element. The substrate holder holds the substrate with opposed two sides among sides of the substrate. The opposed two sides are coupled to a power supply. The auxiliary electrode is configured to assist the plating on the substrate. The power feeding element is configured to supply the auxiliary electrode with an electric power from the power supply. The rectangular substrate having a length L of the sides coupled to the power supply and a length W of sides not coupled to the power supply meeting a condition of:

$$0.8 \times L \leq W \leq L; L \geq 169 \text{ mm; and}$$

W≥211 mm. The power feeding element is coupled to the auxiliary electrode at a center of the auxiliary electrode. The power feeding element is further coupled to the auxiliary electrode by at least one point among $(0, \pm C_y)$, $(\pm C_x, 0)$, and $(\pm C_x, \pm C_y)$.

$C_y$ using mm as its unit is a value meeting conditions of:

$$0.3224L-9.2 \leq C_y; \text{ and}$$

$$C_y \leq 0.3224L+30.8, \text{ while}$$

$C_x$ using mm as its unit is a value meeting conditions of:

$$0.5727W-120.8 \leq C_x; \text{ and}$$

$$C_x \leq 0.5727W-100.8.$$

Here, an x-direction is a direction along the sides of the substrate not coupled to the power supply. Here, a y-direction is a direction along the sides of the substrate coupled to the power supply. Here, (0,0) is a coordinate of a coupling portion of the power feeding element with the auxiliary electrode at the center of the auxiliary electrode.

Further, this application discloses, as one embodiment, the electroplating apparatus, wherein the substrate has a substrate area S larger than 0.14 m² and 0.27 m² or less, and the power feeding elements are coupled to the auxiliary electrode at three points of (0, 0) and $(0, \pm C_y)$.

Further, this application discloses, as one embodiment, the electroplating apparatus, wherein the substrate has a substrate area S larger than 0.23 m² and 0.33 m² or less, and the power feeding elements are coupled to the auxiliary electrode at five points of (0, 0), $(0, \pm C_y)$, and $(\pm C_x, 0)$.

Further, this application discloses, as one embodiment, the electroplating apparatus, wherein the substrate has a substrate area S larger than 0.29 m² and 0.34 m² or less, and the power feeding elements are coupled to the auxiliary electrode at seven points of (0, 0), $(0, \pm C_y)$, and $(\pm C_x, \pm C_y)$.

Further, this application discloses, as one embodiment, the electroplating apparatus, wherein the substrate has a substrate area S larger than 0.36 m², and the power feeding elements are coupled to the auxiliary electrode at nine points of (0, 0), $(0, \pm C_y)$, $(\pm C_x, 0)$, and $(\pm C_x, \pm C_y)$.

In the above-described electroplating apparatuses, the position(s) of the power feeding point(s) is optimized, and thus the apparatuses provide an effect of ensuring further uniform plating.

REFERENCE SIGNS LIST

100 . . . electroplating apparatus
110 . . . plating tank
120 . . . overflow tank
121 . . . circulation line
130 . . . substrate holder
131 . . . substrate
140 . . . auxiliary electrode unit
141 . . . auxiliary electrode
142 . . . power feeding element
143 . . . power feeding point
150 . . . power supply
160 . . . puddle
170 . . . mask
171 . . . opening
600 . . . profile of film thickness in simulation of FIG. 3
601 . . . profile of film thickness in simulation of FIG. 5
800 . . . auxiliary electrode holder
810 . . . reference electrode
811 . . . Luggin capillary
820 . . . electric potential measuring mechanism
900 . . . Luggin capillary holding hole

What is claimed is:

1. A method for determining the location of at least one power feeding point in an electroplating apparatus, wherein
the electroplating apparatus is configured to plate a rectangular substrate having a substrate area of S, the rectangular substrate having opposed two sides coupled to a power supply, the rectangular substrate having a length L of the sides coupled to the power supply and a length W of sides not coupled to the power supply meeting a condition of:
0.8×L≤W≤L, the method comprising
determining a number N of the at least one power feeding point according to the substrate area S, the power feeding point being a point at which an auxiliary electrode electrically contacts a power feeding element, the auxiliary electrode being configured to assist plating on the substrate, the power feeding element being configured to supply the auxiliary electrode with an electric power from the power supply, and
determining N in accordance with conditions of:
with 0<S ≤0.14 m²: N=1;
with 0.14 m²<S ≤0.18 m²: N=1 or 3;
with 0.18 m²<S ≤0.23 m²: N=3;
with 0.23 m²<S≤0.27 m²: N=3 or 5;
with 0.27 m²<S≤0.29 m²: N=5;
with 0.29 m²<S≤0.33 m²: N=5 or 7;
with 0.33 m²<S≤0.34 m²: N=7;
with 0.34 m²<S ≤0.36 m²: N=7 or 9; and
with 0.36 m²<S: N=9.

2. The method for determining the location of the at least one power feeding point according to claim 1, further comprising: positioning one power feeding point at a center of the auxiliary electrode, and further positioning other power feeding points at the following respective points:

with N=3: $(0, \pm C_y)$
with N=5: $(0, \pm C_y)$ and $(\pm C_x, 0)$
with N=7: $(0, \pm C_y)$ and $(\pm C_x, \pm C_y)$
with N=9: $(0, \pm C_y)$, $(\pm C_x, 0)$, and $(\pm C_x, \pm C_y)$, where a direction along the sides of the substrate not coupled to the power supply is an x-direction, a direction along the sides of the substrate coupled to the power supply is a y-direction, and a coordinate of the power feeding point located at the center of the auxiliary electrode is (0, 0).

3. The method for determining the location of the at least one power feeding point according to claim 2, wherein $L \geq 169$ mm, and $W \geq 211$ mm, $C_y$ using mm as a unit meets conditions of:
  $0.3224 L - 9.2 < C_y$; and
  $C_y \leq 0.3224L + 30.8$, while $C_X$ using mm as a unit meets conditions of:
  $0.5727 W - 120.8 \leq C_X$; and
  $C_X \leq 0.5727W - 100.8$.

* * * * *